(12) United States Patent
Edasawa et al.

(10) Patent No.: US 6,375,064 B1
(45) Date of Patent: Apr. 23, 2002

(54) METHOD OF FORMING PROJECTING ELECTRODES AND METHOD OF MANUFACTURING SEMICONDUCTOR DEVICE PROVIDED WITH PROJECTING ELECTRODES

(75) Inventors: Kenji Edasawa, Iruma; Shiro Ozaki, Shiki; Kazuhiro Sugiyama, Kunitachi; Isao Kurashima, Ome, all of (JP)

(73) Assignee: Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/526,665

(22) Filed: Mar. 15, 2000

(30) Foreign Application Priority Data

Mar. 17, 1999 (JP) .......................................... 11-072701

(51) Int. Cl.[7] .......................... B23K 1/08; B23K 37/06; B23K 31/02; B23K 35/12
(52) U.S. Cl. ......................... 228/254; 228/39; 228/245; 228/180.1; 228/179.1; 228/180.22; 156/630
(58) Field of Search ................................. 228/254, 245, 228/179.1, 39, 180.1, 180.22; 29/852; 156/630

(56) References Cited

U.S. PATENT DOCUMENTS

| 3,929,068 A | * | 12/1975 | Budden ................... 101/128.2 |
| 4,572,764 A | * | 2/1986 | Fan ............................. 156/630 |
| 4,706,167 A | * | 11/1987 | Sullivan ....................... 361/406 |
| 4,756,080 A | * | 7/1988 | Thorp, Jr. et al. ............. 29/827 |
| 4,964,948 A | * | 10/1990 | Reed ........................ 156/659.1 |
| 5,221,428 A | * | 6/1993 | Ohsawa et al. .............. 156/652 |
| 5,244,143 A | * | 9/1993 | Ference et al. ......... 228/180.21 |
| 5,303,647 A | * | 4/1994 | Seo et al. .................... 101/125 |
| 5,492,266 A | * | 2/1996 | Hoebener et al. ......... 228/248.1 |
| 5,493,075 A | * | 2/1996 | Chong et al. ................ 174/261 |
| 5,499,756 A | * | 3/1996 | Banerji et al. ............... 228/214 |
| 5,822,856 A | * | 10/1998 | Bhatt et al. ................... 29/832 |
| 5,840,417 A | * | 11/1998 | Bolger ......................... 428/323 |
| 6,000,129 A | * | 12/1999 | Bhatt et al. ................... 29/852 |
| 6,138,350 A | * | 10/2000 | Bhatt et al. ................... 29/852 |

FOREIGN PATENT DOCUMENTS

| JP | 1-289144 | * | 11/1989 | ................... 228/39 |
| JP | 10-98257 | * | 4/1998 | ................... 228/39 |

* cited by examiner

*Primary Examiner*—Tom Dunn
*Assistant Examiner*—L. Edmondson
(74) *Attorney, Agent, or Firm*—Frishauf, Holtz, Goodman, Langer & Chick, P.C.

(57) ABSTRACT

A conductive paste is loaded in circular holes made in a reinforcing film of a carrier tape which includes a film substrate and the reinforcing film, followed by applying a heat treatment to the conductive paste to form projecting electrodes consisting of solder. Then, the reinforcing film is peeled off to permit the projecting electrode to project from the film substrate.

15 Claims, 12 Drawing Sheets

METHOD OF FORMING PROJECTING ELECTRODES AND METHOD OF MANUFACTURING SEMICONDUCTOR DEVICE PROVIDED WITH PROJECTING ELECTRODES

CROSS-REFERENCE TO RELATED APPLICATION

This application is based upon and claims the benefit of priority from the prior Japanese Patent Application No. 11-072701, filed Mar. 17, 1999, the entire contents of which are incorporated herein by reference.

BACKGROUND OF THE INVENTION

The present invention relates to a method of forming projecting electrodes and a method of manufacturing a semiconductor device provided with projecting electrodes.

In a semiconductor device called, for example, GBA (ball grid array), a semiconductor circuit consisting of an LSI, etc. is mounted on an interposer and solder balls (projecting electrodes) are arranged to form a matrix on the lower surface of the interposer. FIGS. 31 to 35 are cross sectional views collectively exemplifying the conventional method of manufacturing a semiconductor device of this type. As shown in FIG. 31, an interposer 1 consists of a film substrate somewhat larger than the planar size of a semiconductor circuit 5. Mounted on one surface of the interposer 1 are a plurality of first connection pads 2 and a plurality of second connection pads 3 arranged to form a matrix and connected, respectively, to the first connection pads 2 via connection wirings (not shown). The interposer 1 is provided with a plurality of open portions 4 arranged to conform with the second connection pads 3 and extending through the interposer 1 in its thickness direction. The plural first connection pads 2 are connected to the semiconductor circuit 5 via a plurality of bump electrodes 4, respectively. Also, the semiconductor circuit 5 is covered with a resin sealing film 6. As shown in FIG. 32, a metal mask 7 having a plurality of open portions 8 arranged to form a matrix and conforming with the plural open portions 4, respectively, is disposed on the interposer 1 to align the open portions 8 and 4. The open portion 8 is equal to the open portion 4 made in the interposer 1 in the shape and size in the planar direction. Then, the surface of the structure is coated with a conductive paste 9 consisting of a semi-molten solder paste to fill the open portions 4 and 8. The metal mask 7 is made of a metal low in its adhesivity to the conductive paste 9. However, since it is possible for the metal mask 7 to be bonded to the solidified solder after the conductive paste 9 is solidified, the metal mask 7 is removed while the conductive paste 9 is in a molten state, as shown in FIG. 33. Then, the plural conductive pastes 9 are solidified by a reflow treatment to form a plurality of solder bumps 10, as shown in FIG. 34. It follows that the solder bumps 10 are arranged to form a matrix, as shown in FIG. 35.

In the conventional semiconductor device of this type, a flux coating tool or the metal mask 7 of the structure conforming with the arrangement of the open portions 4 of the interposer 1 is used in the coating step of the conductive paste 9. This gives rise to the problem that, if the arrangement of the open portions 4 is changed in accordance with the design of the semiconductor circuit 5, etc., it is necessary to use a flux coating tool or the metal mask 7 conforming with the arrangement of the open portions 4. It should also be noted that the height of the projecting portion of the solder bump 10 from the interposer 1 should desirably be at least 0.2 mm in view of the bonding capability of the solder bump 10 to the external circuit. If the metal mask 7 is made thicker for ensuring a sufficient height of the projecting portion of the solder bump 10, however, the contact area between the open portion 8 of the metal mask 7 and the conductive paste 9 filling the open portion 8 is increased, giving rise to serious problems. For example, it is possible for a part or the entire portion of the conductive paste 9 positioned within the open portion 8 to be pulled up when the metal mask 7 is pulled up. Alternatively, the conductive paste 9 is likely to be deformed by a slight impact or the like given to the paste 9 after the metal mask 7 is detached from the conductive paste 9. It may be possible to prevent the deformation by decreasing the ratio of the solvent contained in the conductive paste. In this case, however, the bonding strength between the conductive paste 9 and the metal mask 7 is increased, with the result that the a part or the entire portion of the conductive paste 9 within the open portion 8 is likely to be pulled up when the metal mask 7 is pulled up. It follows that it is difficult to form the solder bumps 10 having a sufficient height and a uniform shape by using the metal mask 7. What should also be noted is that, if the conductive paste attached to the open portion 8 of the metal mask 7 is solidified as it is, the open portion is diminished so as to make it impossible to use again the metal mask 7. It follows that it is necessary to wash the metal mask 7 to remove the conductive paste attached thereto every time the printing is performed by using the metal mask 7 or after the printing is performed only a few times, leading to a low productivity.

BRIEF SUMMARY OF THE INVENTION

An object of the present invention is to form satisfactory projecting electrodes on a substrate with a high productivity.

According to a first aspect of the present invention, there is provided a method of forming projecting electrodes, comprising forming a plurality of holes through a laminate structure including a first film having a plurality of electrodes arranged on one surface thereof and a second film attached to the other surface of the first film, the plurality of holes conforming with the plurality of electrodes; loading a conductive paste in the plural holes; hardening the conductive paste to form the projecting electrodes; and peeling the second film from the first film with the projecting electrodes left mounted on the first film.

In the method of the present invention for forming projecting electrodes, the conductive paste loaded in the holes extending through the laminate structure including the first film and the second film is hardened, followed by peeling the second film off the first film. Naturally, it is impossible for the entire region forming the projecting electrode of the conductive paste to be exposed to the outside in a non-hardened state. It follows that the projecting electrode is not deformed when the second film is peeled off the first film. It should also be noted that, since the second film can be set at an optional thickness, the projecting electrode formed within the hole in the second film can be allowed to project from the first film in a desired height. What should also be noted is that, if the conductive paste is loaded in the hole by a screen printing method using the second film as a printing mask, the projecting electrode consisting of, for example, a solder can be formed on the first film without fail without using an exclusive printing mask.

According to a second aspect of the present invention, there is provided a method of manufacturing a semiconductor device provided with projecting electrodes, comprising forming a plurality of holes through a laminate structure including a first film having a plurality of first electrode terminals and a plurality of second electrode terminals connected respectively to the plurality of first electrode terminals, the first and second electrode terminals being arranged on one surface the first film, and a second film attached the other surface of the first film, the plurality of holes conforming, respectively, with the plurality of second electrode terminals; connecting a plurality of electrode terminals of a semiconductor circuit to the plurality of first electrodes, respectively; loading a conductive paste in the plurality of holes conforming with the plurality of second electrode terminals; hardening the conductive paste to form the projecting electrodes; and peeling the second film from the first film with the projecting electrodes left mounted on the first film.

The particular method of the present invention makes it possible to connect easily the semiconductor circuit to the projecting electrodes having a sufficient height.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

FIGS. 1 to 12A, 12B collectively show a method of manufacturing a semiconductor device according to a first embodiment of the present invention. How to manufacture the semiconductor device of the first embodiment will now be described with reference to these figures.

Figure 1:
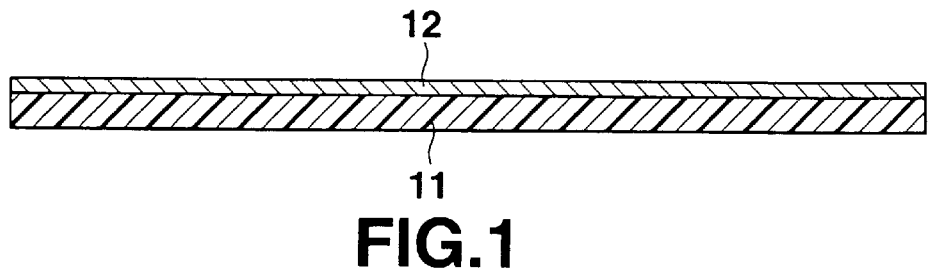
FIG. 1 is a cross sectional view showing a film substrate and a conductive layer prepared in manufacturing a semiconductor device according to a first embodiment of the present invention.
Figure 2:
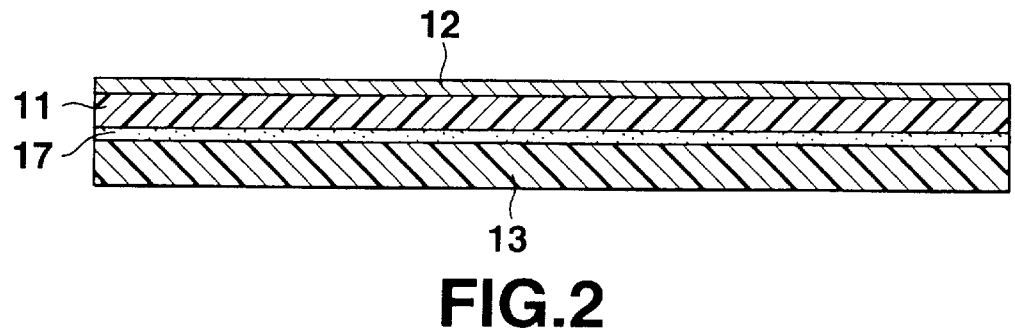
FIG. 2 is a cross sectional view showing the manufacturing step of the semiconductor device following the step shown in FIG. 1.

In the first step, a copper foil is formed by a sputtering method on an upper surface of an elongated film substrate 11 used as an interposer and formed of a polyimide film having a thickness of about 25 to 75 $\mu$m, followed by depositing copper on the copper foil in a thickness of about 6 to 18 $\mu$m by an electrolytic process so as to form a conductive layer 12, as shown in FIG. 1. A reinforcing film 13 consisting of, for example, PES (polyether sulfone) or PEI (polyether imide) is laminated on the lower surface of the film substrate 11 with an adhesive 17 that is not solidified under room temperature and atmospheric pressure interposed therebetween, as shown in FIG. 2. The reinforcing film 13, which is also an elongated member and equal to the film substrate 11 in the size and shape, serves to produce a stability of transfer as a carrier tape while maintaining a mechanical strength in the thickness direction of the carrier tape as described herein later and also plays the role of forming a solder ball of a suitable size.

Figure 3:
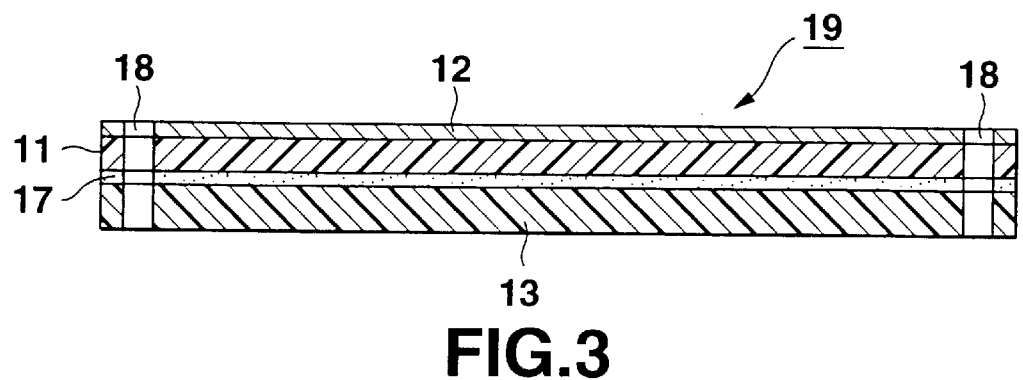
FIG. 3 is a cross sectional view showing the manufacturing step of the semiconductor device following the step shown in FIG. 2.

In the next step, two groups of sprocket holes 18 extending through the film substrate 11, the conductive layer 12, the reinforcing film 13 and the adhesive mass layer 17 are formed punching with a mold on both side edge portions in the width direction of the film substrate 11, as shown in FIG. 3. Each group of the sprocket holes 18 formed in the side edge portion in the width direction of the film substrate 11 consist of a plurality of holes formed a predetermined distance apart from each other in the longitudinal direction of the film substrate 11. As a result, a carrier tape 19 is formed.

Figure 4:
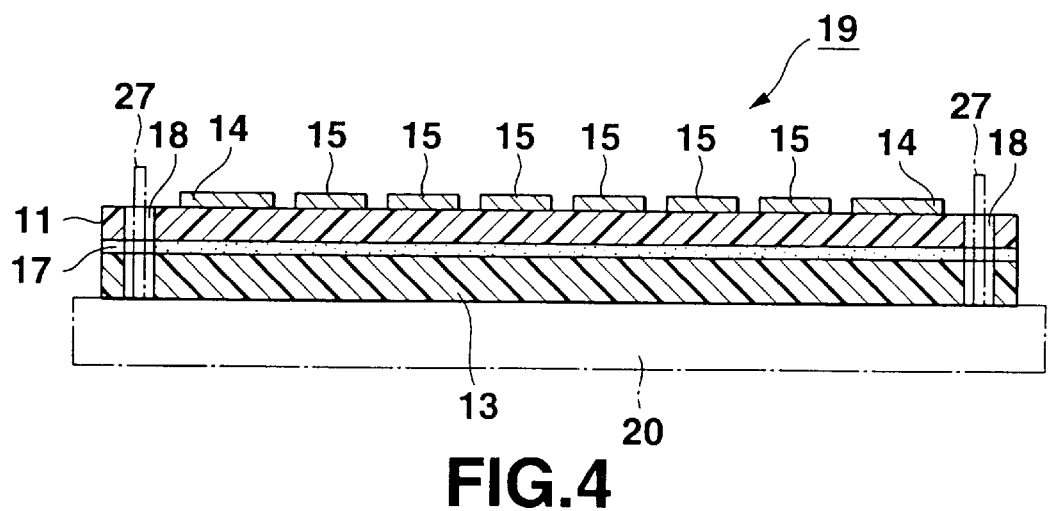
FIG. 4 is a cross sectional view showing the manufacturing step of the semiconductor device following the step shown in FIG. 3.

The carrier tape 19 is arranged to permit a plurality of pairs of pins 27 of a pin roller 20 denoted by an imaginary line in FIG. 4 to be housed in corresponding sprocket holes 18, with the result that the carrier tape 19 is transferred on a roll-to-roll basis. Where it is desired to set the height of the solder ball at 0.2 mm or more, a desirable thickness of the reinforcing film 13 is about 250 to 500 $\mu$m. Where it is intended to improve the productivity of the projecting electrodes, a desirable thickness of the reinforcing film 13 is about 25 to 500 $\mu$m. The reinforcing film 13 plays several roles. One of the roles played by the reinforcing film 13 is to reinforce the film substrate 11 so as to ensure transfer of the carrier tape 19 during the manufacturing process. Then, a patterning resist mask of a predetermined pattern is formed on the conductive layer 12 by a photo-lithographic method. The conductive layer 12 is subjected to a wet etching using the resist mask thus formed so as to form a plurality of first connection pads 14, a plurality of second connection pads 15 and a plurality of connection wirings 28 (see FIG. 12B) for connecting the first connection pads 14 to the second connection pads 15, respectively. The second connection pads 15 are arranged on the film substrate 11 to form a matrix. On the other hand, the first connection pads 14 are arranged to form two sides or four sides of the outer periphery of the matrix pattern formed by the second connection pads 15.

In the next step, the carrier tape 19 is turned upside down and arranged again to permit the pins 27 of the pin roller 20 to be inserted into the sprocket holes 18. Under this condition, the carrier tape 19 is irradiated with a $CO_2$ laser, a YAG laser, an excimer laser or the like to form a large number of circular holes 16 extending through the films 11, 13 and the adhesive mass layer 17 in portions corresponding to the central portions of the second connection pads 15. Naturally, these circular holes 16 are arranged to form a matrix like the second connection pads 15. The cross sectional area of the circular hole 16 in a planar direction of the film substrate 11 is smaller than the cross sectional area of the each of the connection pads 14 and 15 in the planar direction of the film substrate 11. Also, the end of the circular hole 16 on the side of the film substrate 11 is covered completely with the first or second connection pad. Then, the smear of the carrier tape 19 generated by the laser processing is removed by a de-smear treatment such as a treatment with a permanganate solution or a plasma etching. Further, the surfaces of the first connection pads 14, the second connection pads 15 that are exposed to the outside through the circular holes 16 and the connection wirings 28 positioned between the first and second connection pads are covered with a double-layered plating structure of Au/Ni or with a plating layer of Sn or the like by an electroless plating method.

Figure 6:
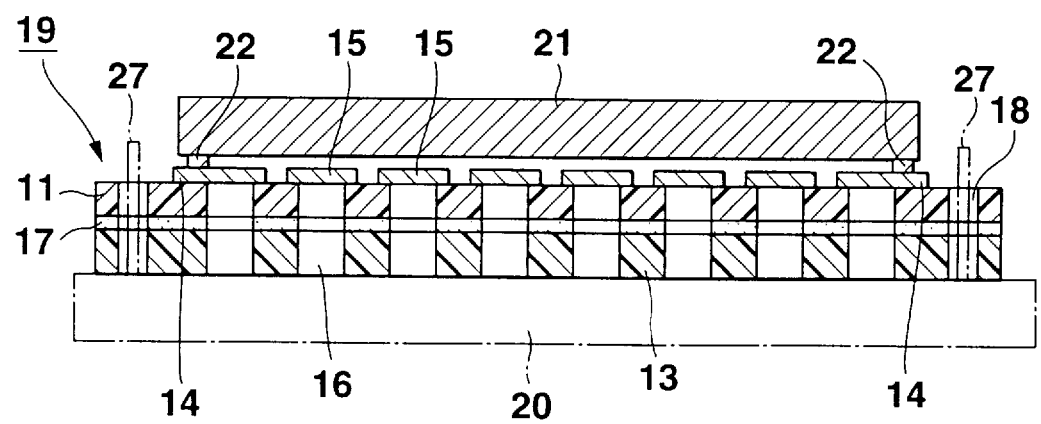
FIG. 6 is a cross sectional view showing the manufacturing step of the semiconductor device following the step shown in FIG. 5.
Figure 7:
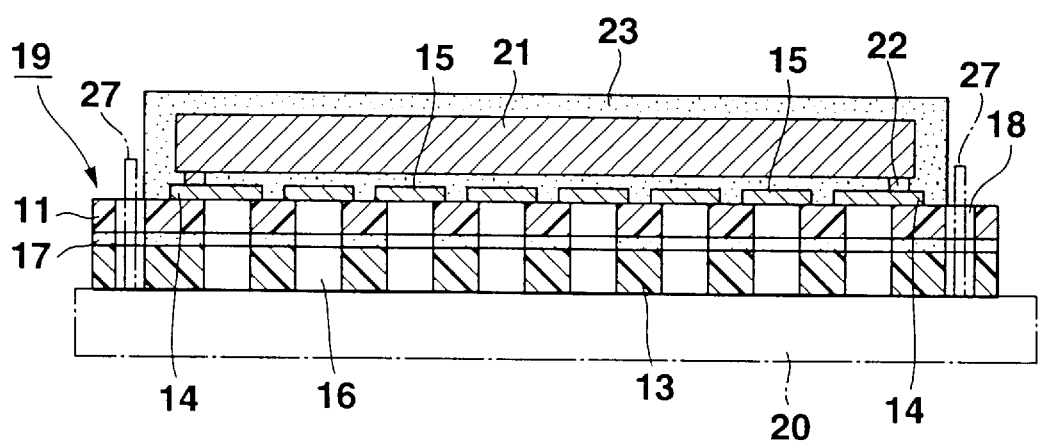
FIG. 7 is a cross sectional view showing the manufacturing step of the semiconductor device following the step shown in FIG. 6.

In the next step, the carrier tape 19 is turned upside down again to permit the pins 27 of the pin roller 20 to be inserted again into the sprocket holes 18, as shown in FIG. 6. In this step, a semiconductor circuit 21, for example, consisting of an LSI or the like is mounted to the film substrate 11 by a face-down system by bonding a plurality of bump electrodes 22 mounted to a lower peripheral portion of the semiconductor substrate 21 to the corresponding first connection pads 14, respectively. Further, a resin sealing film 23, for example, consisting of an epoxy resin is formed by, for example, a screen printing method on the upper surface of the film substrate 11 including the semiconductor circuit 21 except the portions where sprocket holes are to be formed, as shown in FIG. 7.

Figure 8:
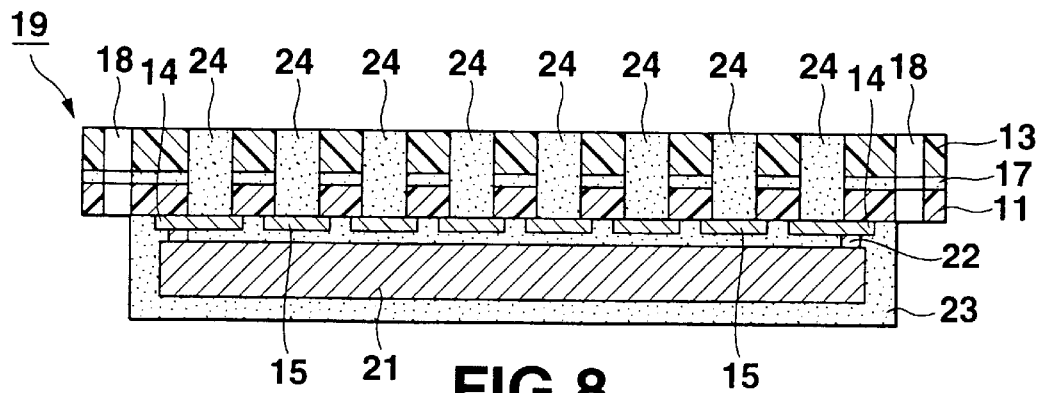
FIG. 8 is a cross sectional view showing the manufacturing step of the semiconductor device following the step shown in FIG. 7.
Figure 9:
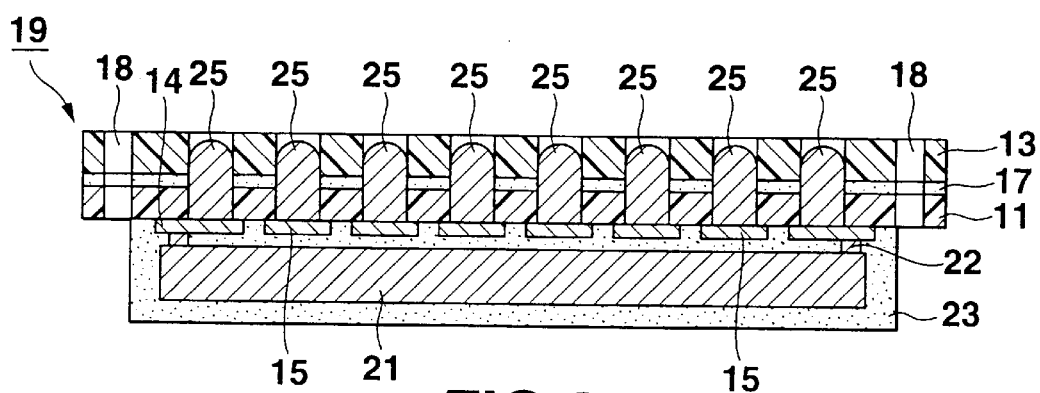
FIG. 9 is a cross sectional view showing the manufacturing step of the semiconductor device following the step shown in FIG. 8.

In the next step, the carrier tape 19 is turned upside down again so as to fill the circular holes 16 extending through the films 11 and 13 with a conductive paste 24 consisting of a solder paste containing lead by a screen printing method that does not use a printing mask, i.e., a screen printing method using the reinforcing film 13 as a printing mask, as shown in FIG. 8. In this case, the conductive paste is loaded not only in the circular holes 16 of film substrate 11 but also in the circular holes 16 of the reinforcing film 13 having a thickness of 25 to 500 $\mu$m. Therefore, the conductive paste 24 can be loaded in a sufficiently large amount. In other words, even if the conductive paste 24 is coated or loaded by a screen printing method, it is possible to ensure a sufficiently large coating amount.

Figure 10:
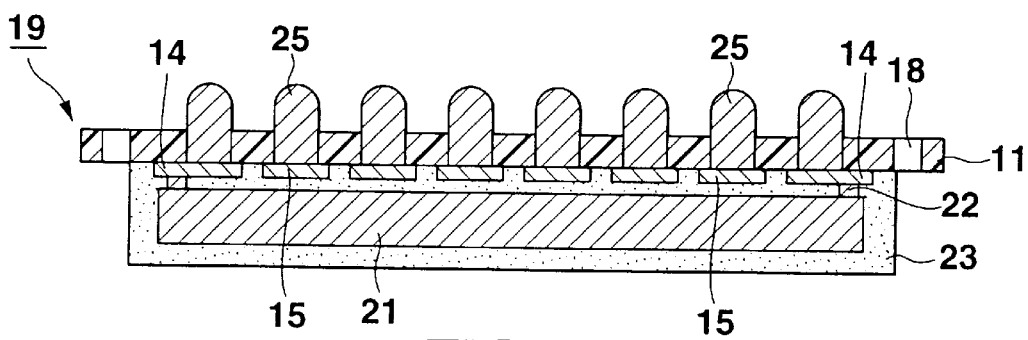
FIG. 10 is a cross sectional view showing the manufacturing step of the semiconductor device following the step shown in FIG. 9.
Figure 11:
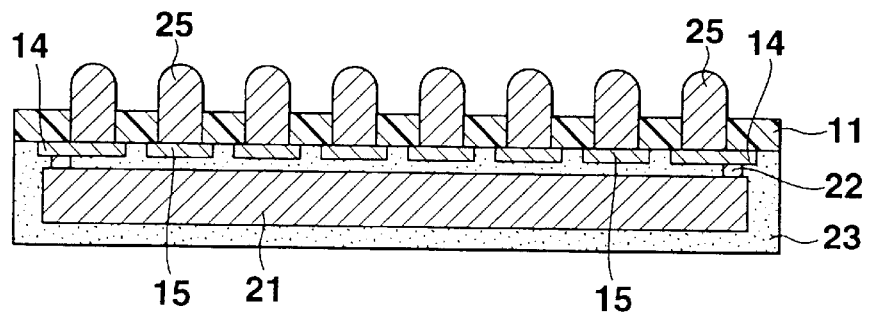
FIG. 11 is a cross sectional view showing the manufacturing step of the semiconductor device following the step shown in FIG. 10.

In the next step, a heat treatment is applied to the conductive paste at about 230° C. so as to evaporate the organic material such as a solvent contained in the conductive paste 24. As a result, the solder remaining within the conductive paste 24 forms solid columnar electrodes (projecting electrodes) 25 within the circular holes 16 formed in the films 11 and 13. In this case, the head portion of the columnar electrode 25 is made roundish by the surface tension of the solder in a molten state so as to form a substantially hemispherical configuration. Also, it is possible to achieve a reasonable height of the columnar electrode 25 because the conductive paste 24 is coated (loaded) in a sufficiently large amount. In addition, the height can be controlled as desired by controlling the thickness of the reinforcing film 13. In the next step, the reinforcing film 13 is peeled off together with the adhesive mass layer 17 so as to form the structure as shown in FIG. 10. As apparent from the figure, the columnar electrode 25 projects from the film substrate 11 in the state shown in FIG. 10. Then, the both edge portions, in which the sprocket holes 18 are arranged, of the film substrate 11 are cut away. In other words, the film substrate 11 is cut away appropriately so as to obtain a plurality of semiconductor devices, as shown in FIG. 11. In this step, it is possible to cut away appropriately the unnecessary portion of the resin sealing film 23, as desired.

In the method of manufacturing a semiconductor device described above, a screen printing method is employed for loading the conductive paste 24 into the circular holes 16 extending through the films 11 and 13, making it possible to load without fail the conductive paste 24 in all the circular holes 16. It follows that it is possible to form the columnar electrodes 25 made of a solder on the film substrate 11.

Figure 12A:
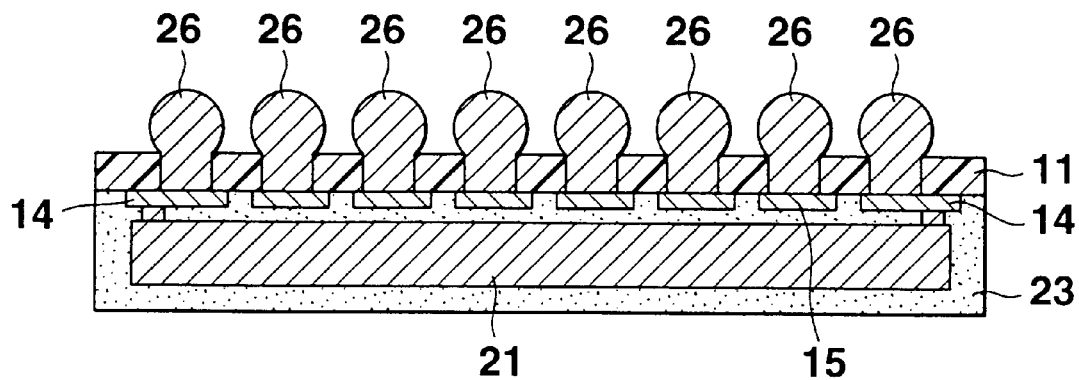
FIG. 12A is a cross sectional view showing the manufacturing step shown in FIG. 11.
Figure 12B:
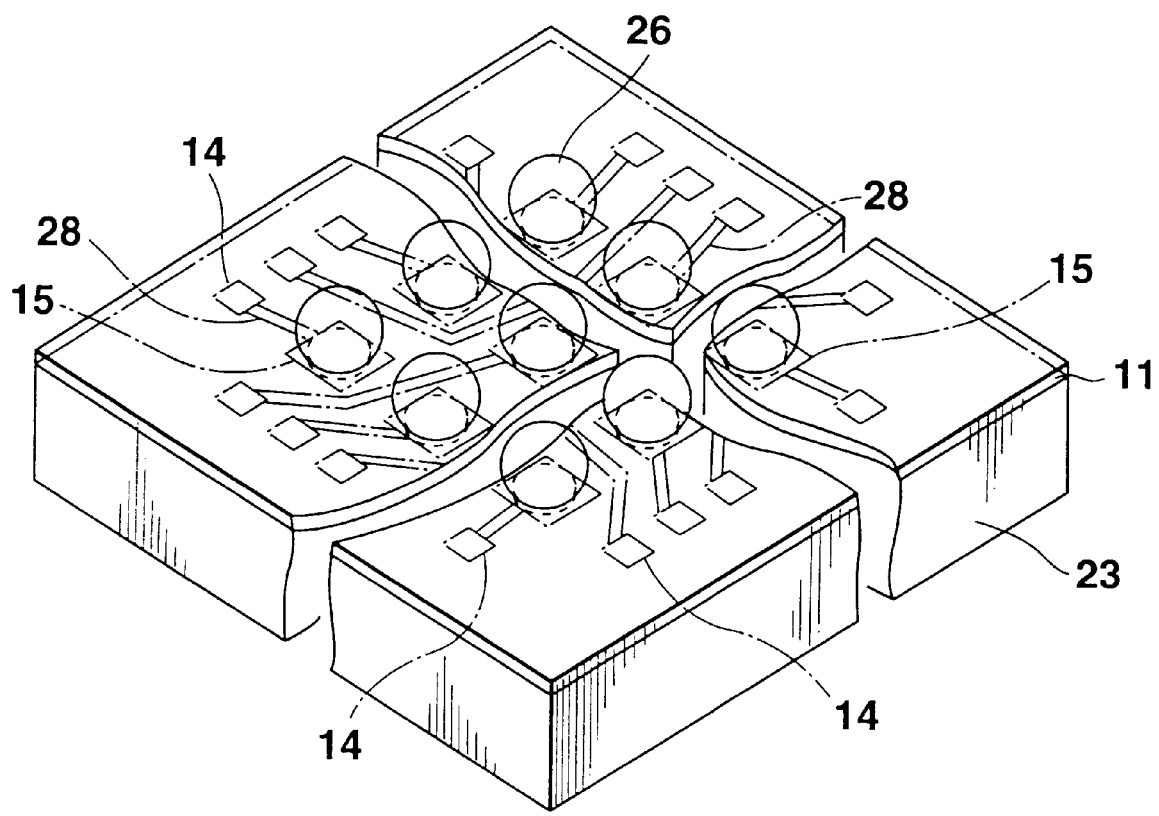
FIG. 12B is an oblique view showing the step shown in FIG. 12A.

It is possible to apply a reflow treatment after the manufacturing step shown in FIG. 10 or 11 so as to melt the columnar solder projecting from the film substrate 11 as shown in FIG. 12A. In this case, the head portion of the columnar solder is made close to a sphere to form a solder ball (projecting electrode) 26. FIG. 12B is an oblique view showing the semiconductor device shown in FIG. 12A. As shown in the figure, a plurality of first connection pads 14 connected respectively to a plurality of bump electrodes 22 of a semiconductor circuit 21 are connected respectively to a plurality of second connection pads 15, which are connected respectively to a plurality of solder balls 26 arranged to form a matrix, through connection wirings 28.

Figure 5:
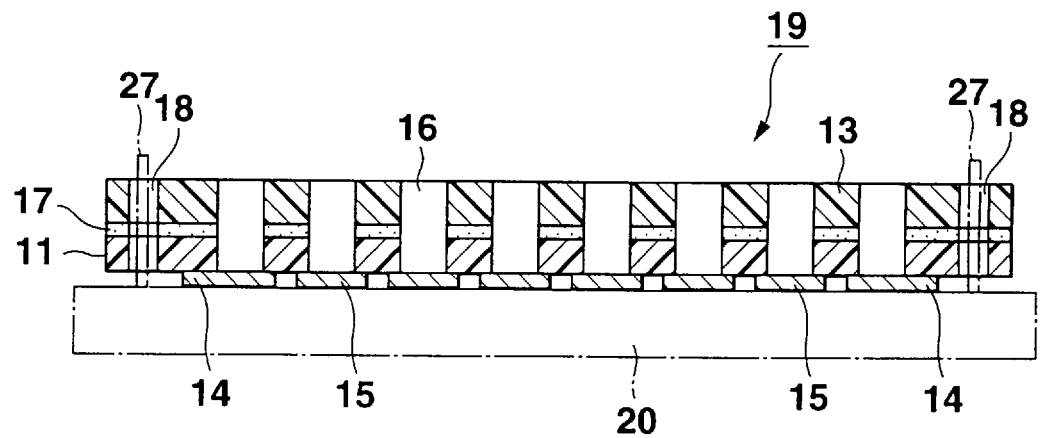
FIG. 5 is a cross sectional view showing the manufacturing step of the semiconductor device following the step shown in FIG. 4.
Figure 13:
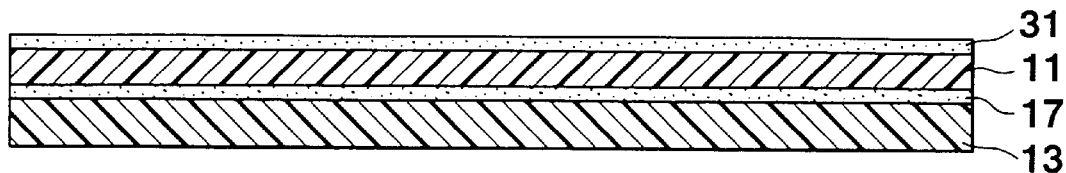
FIG. 13 is a cross sectional view showing a film substrate, a conductive layer, and a reinforcing film preparing in manufacturing a semiconductor device according to a second embodiment of the present invention.
Figure 14:
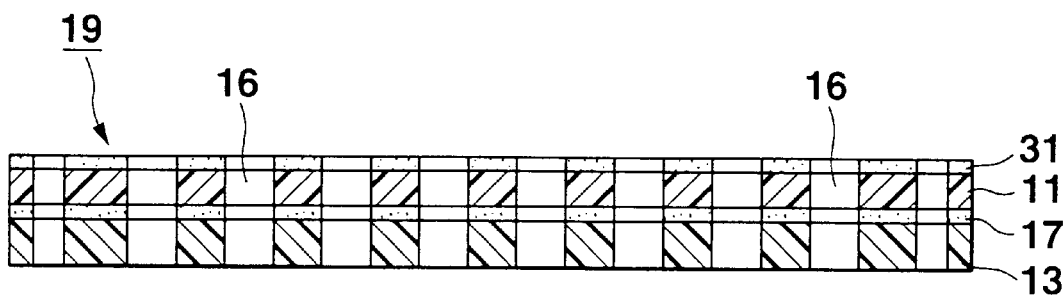
FIG. 14 is a cross sectional view showing the manufacturing step of the semiconductor device following the step shown in FIG. 13.
Figure 15:
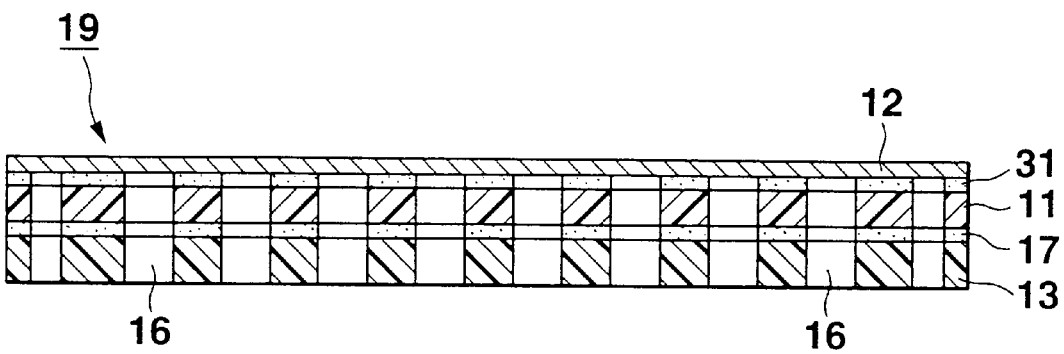
FIG. 15 is a cross sectional view showing the manufacturing step of the semiconductor device following the step shown in FIG. 14.
Figure 16:
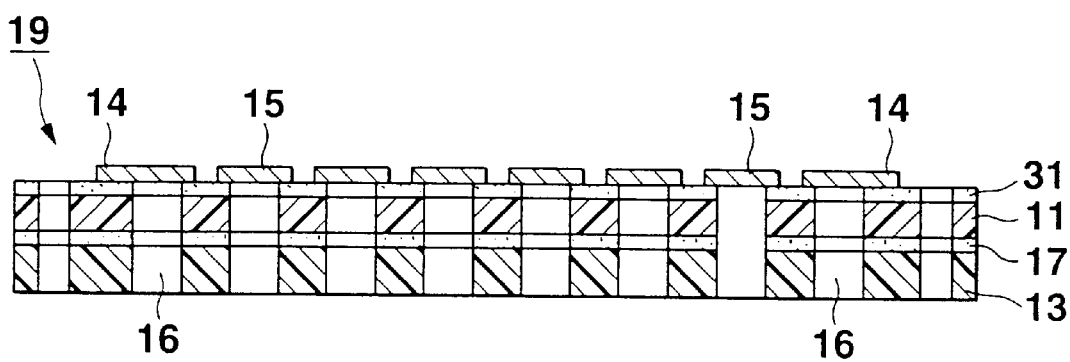
FIG. 16 is a cross sectional view showing the manufacturing step of the semiconductor device following the step shown in FIG. 15.

In the embodiment described above, the circular holes 16 are formed through the films 11 and 13 by means of a laser irradiation in the manufacturing step shown in FIG. 5. However, the means for forming the circular holes 16 is not limited to the laser irradiation. For example, an adhesive layer 31, which is not yet solidified, is formed on the upper surface of the film substrate 11, followed by laminating the reinforcing film 13 on the lower surface of the film substrate 11 with an adhesive mass layer 17 interposed therebetween, as shown in FIG. 13. Then, the circular holes 16 are formed through the films 11, 13, the adhesive layer 31 and the adhesive mass layer 17 by punching, as shown in FIG. 14, followed by laminating a copper foil (conductive layer) 12 on the upper surface of the film substrate 11 with the adhesive layer 31 interposed therebetween, as shown in FIG. 15. Then, the conductive layer 12 is patterned with a photoresist used as a mask so as to form the first connection pad 14, the second connection pad 15 and the connection wiring (not shown) for connecting the first and second connection pads 14 and 15, as shown in FIG. 16. Description of the subsequent steps, which are equal to the steps after the step of mounting the semiconductor circuit shown in FIG. 6, is omitted.

Figure 17:
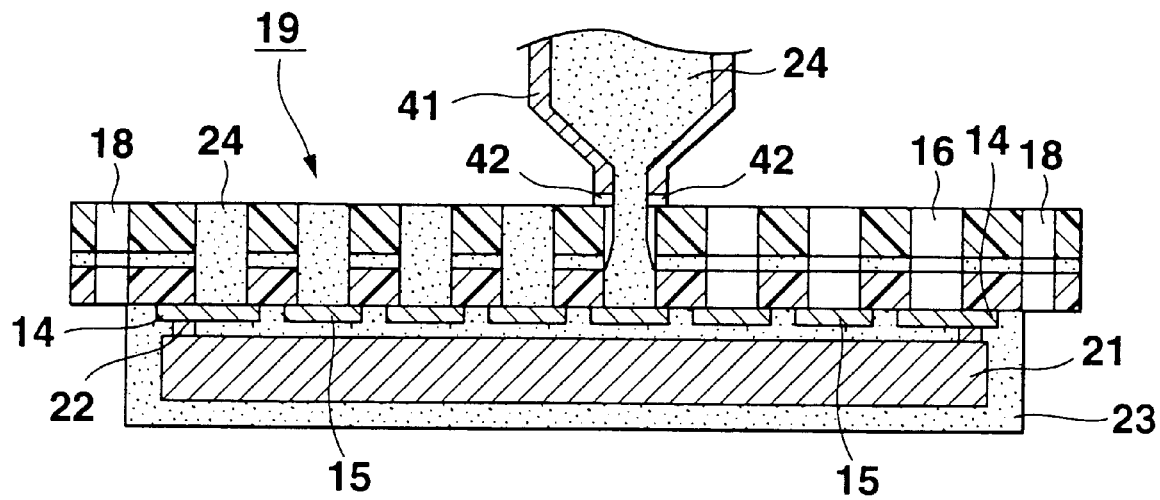
FIG. 17 is a cross sectional view showing the loading step of a conductive paste.
Figure 18:
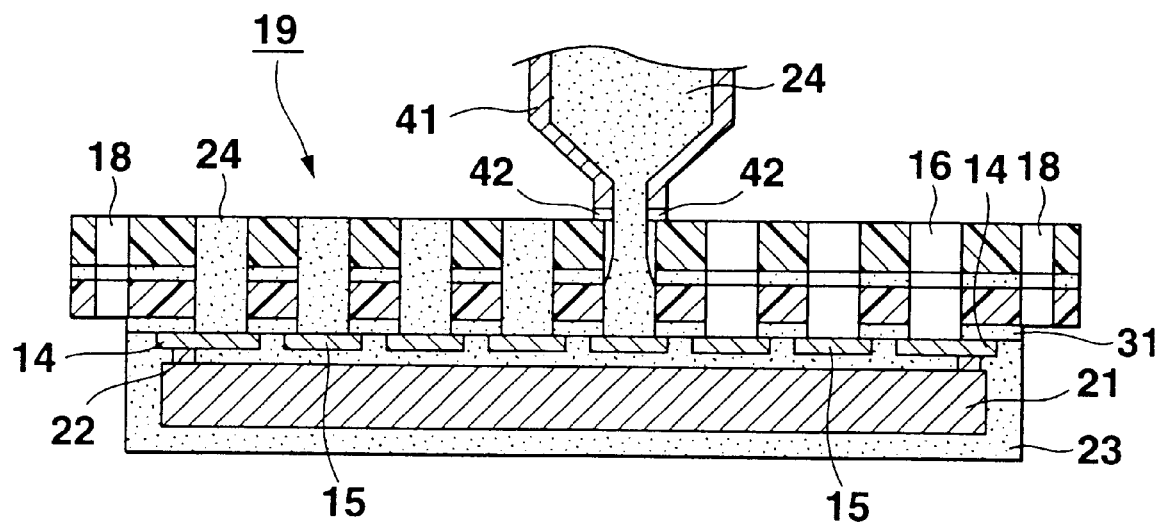
FIG. 18 is a cross sectional view showing the loading step of a conductive paste using another carrier tape.

In each of the embodiments described above, the conductive paste 24 is loaded in the circular hole 16 extending through the films 11 and 13 by means of a screen printing method. However, the method of supplying the conductive paste is not limited to the screen printing method. For example, it is possible to load the conductive paste 24 in the circular hole 16 of the films 11, 13 by using a linear injection nozzle 41 as shown in FIGS. 17 and 18. In this case, the conductive paste 24 can be loaded in the circular hole 16 of the films 11 and 13 promptly and at a high density by applying pressure to the conductive paste 24 to permit the conductive paste to be injected from the injection nozzle 41, the inner temperature of which is controlled to maintain the conductive paste 24 at a low viscosity, into the circular hole 16. A rubber member 42 is mounted to the tip portion of the injection nozzle 41.

Figure 19:
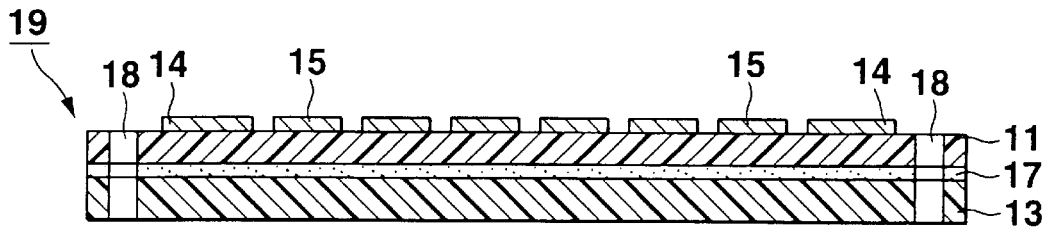
FIG. 19 is a cross sectional view showing a carrier tape prepared for manufacturing a semiconductor device according to a third embodiment of the present invention.
Figure 20:
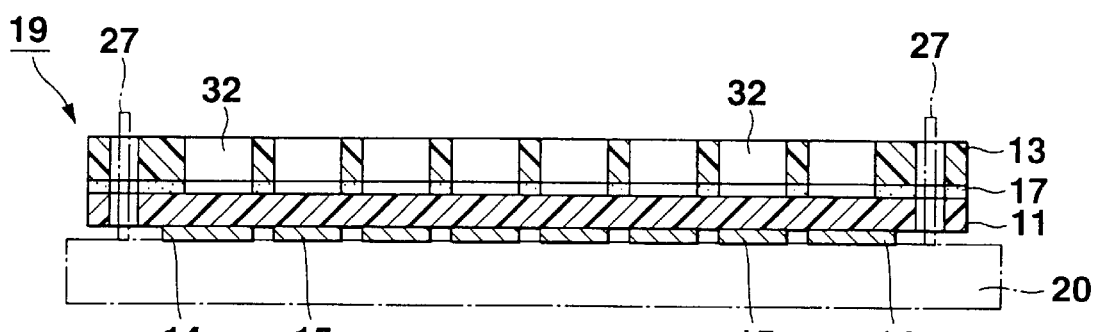
FIG. 20 is a cross sectional view showing the manufacturing step of the semiconductor device following the step shown in FIG. 19.
Figure 21:
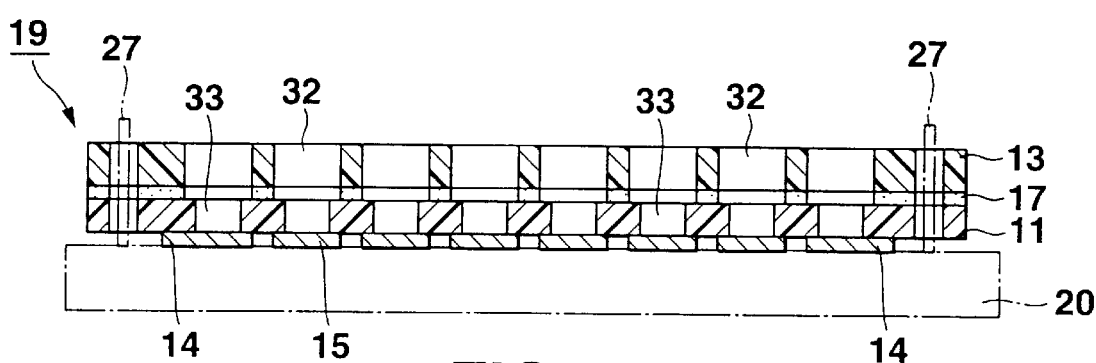
FIG. 21 is a cross sectional view showing the manufacturing step of the semiconductor device following the step shown in FIG. 20.
Figure 22:
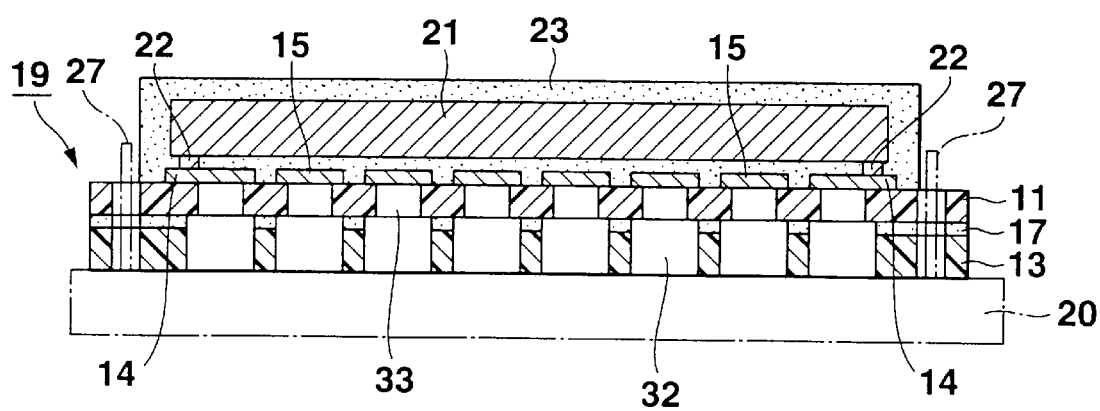
FIG. 22 is a cross sectional view showing the manufacturing step of the semiconductor device following the step shown in FIG. 21.
Figure 23:
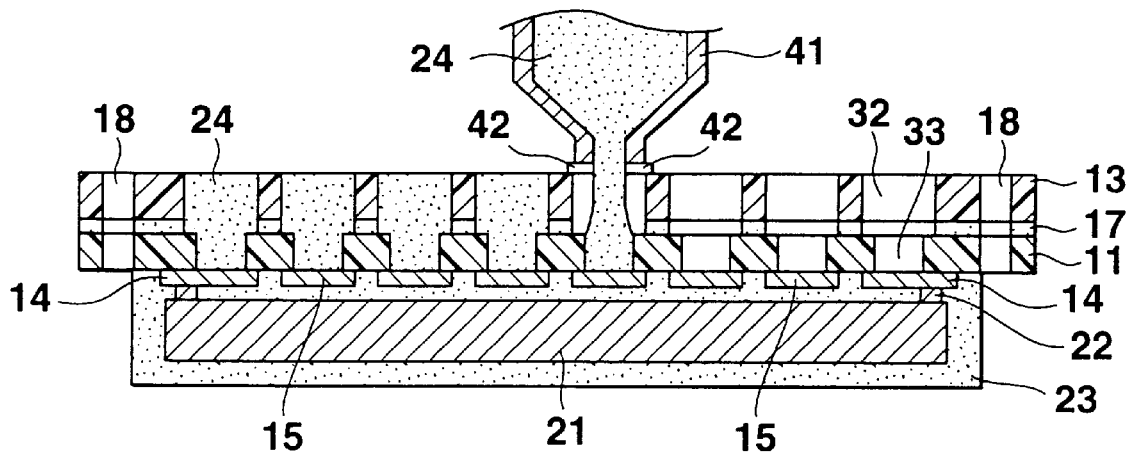
FIG. 23 is a cross sectional view showing the manufacturing step of the semiconductor device following the step shown in FIG. 22.
Figure 24:
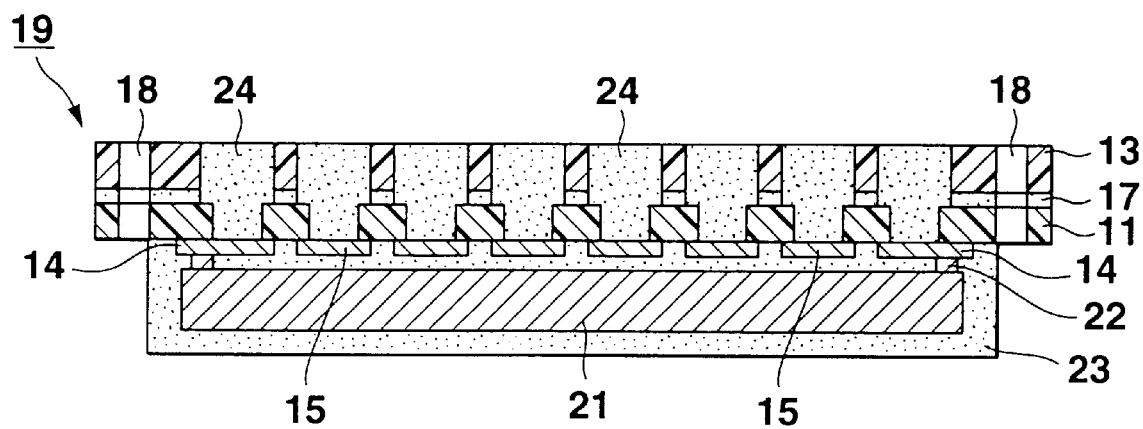
FIG. 24 is a cross sectional view showing the manufacturing step of the semiconductor device following the step shown in FIG. 22 or 23.

In the embodiment described above, the circular holes 16 of the same diameter are formed through the films 11 and 13 by means of a laser irradiation in the manufacturing process shown in FIG. 5. However, the method of forming the circular hole is not limited to the method noted above. For example, a plurality of first connection pads 14, a plurality of second connection pads 15 and a plurality of connection wirings 28 for connecting the first and second connection pads 14 and 15 are formed on an upper surface of an elongated film substrate 11 made of polyimide and having a thickness of about 25 to 75 μm, as shown in FIG. 19. Also, the reinforcing film 13 made of PI, PES, PEI, PET, etc. is laminated on the lower surface of the film substrate 11 with the adhesive mass layer 17 interposed therebetween. Two groups of sprocket holes 18 extending through the film substrate 11, the conductive layer 12, the reinforcing film 13 and the adhesive mass layer 17 are formed in both side portions in the width direction of the film substrate 11 so as to form the carrier tape 19. As shown in FIG. 20, the carrier tape 19 is turned upside down, and circular holes 32 having a predetermined diameter are formed in those portions of the reinforcing film 13 and the adhesive mass layer 17 which correspond to the second connection pads 15 by irradiation with an excimer laser, a YAG laser, etc. that makes it possible to control the etch rate so as to expose the film substrate 11 to the outside. Then, circular holes 33 having a diameter smaller than that of the circular holes 32 are formed in those portions of the film substrate 11 which correspond to the second connection pads 15 by diminishing the working size of the laser beam so as to expose the second connection pads 15 to the outside, as shown in FIG. 21. Since the circular hole 32 has a relatively large diameter, a void having a sufficiently large inner volume can be formed in this case. Then, the carrier tape 19 is turned upside down again as shown in FIG. 22 so as to permit the bump electrodes 22 mounted to the peripheral portion on the lower surface of the semiconductor circuit 21 to be bonded to the first connection pads 14. As a result, the semiconductor circuit 21 is mounted to the film substrate 11 by a face-down system. Under this condition, the resin sealing film 23 is formed on the upper surface of the film substrate 11 including the semiconductor circuit 21 except the portions where sprocket holes are to be formed. Then, the conductive paste 24 is loaded in the circular holes 32, 33 as shown in FIG. 24 by a screen printing method or by using a linear injection nozzle 41 shown in FIG. 23.

Figure 25:
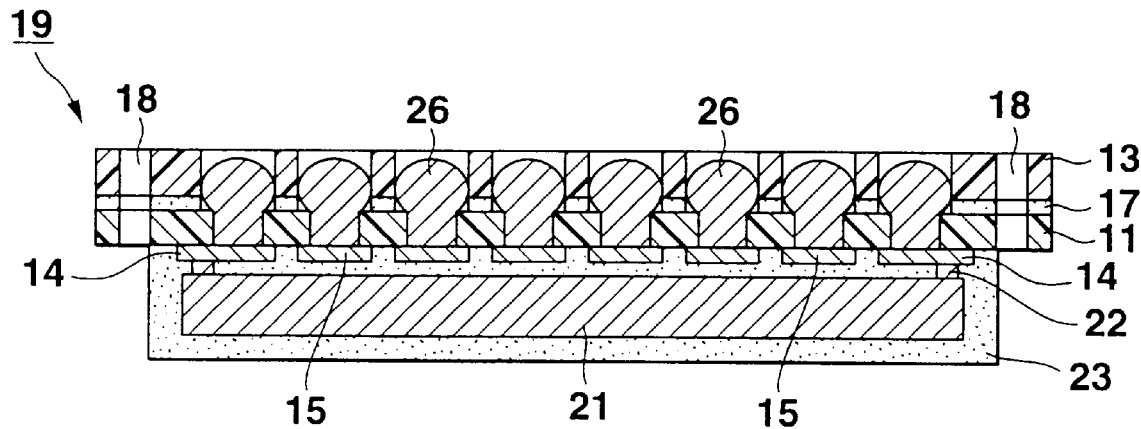
FIG. 25 is a cross sectional view showing the manufacturing step of the semiconductor device following the step shown in FIG. 24.

In this case, the inner volume of the circular hole 32 can be made relatively large even if the reinforcing film 13 is relatively thin, making it possible to increase the height of the solder ball 26 to some extent, as shown in FIG. 25. Finally, the reinforcing film 13 is peeled off the film substrate 11 together with the adhesive mass layer 17, followed by cutting the unnecessary portion of the film substrate 11 so as to obtain a semiconductor device as shown in FIGS. 12A and 12B.

Figure 26:
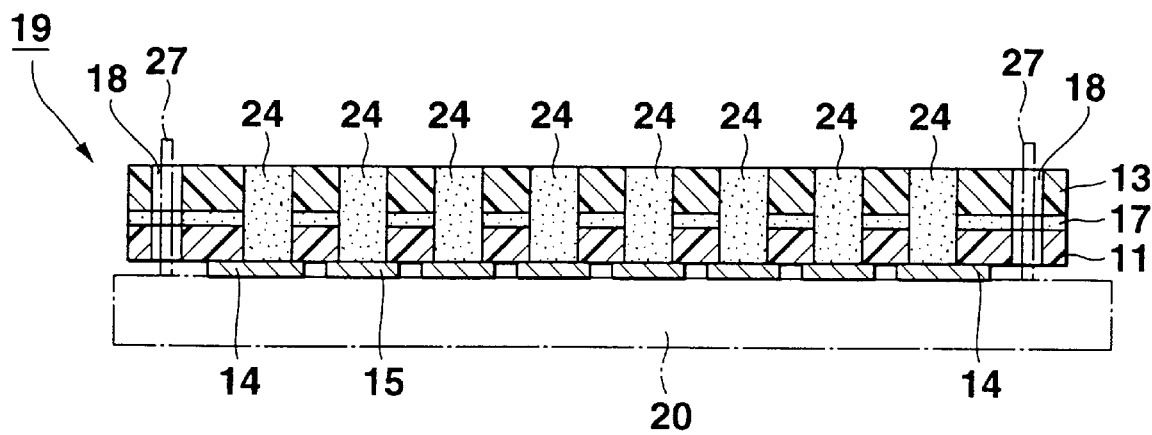
FIG. 26 is a cross sectional view showing a carrier tape prepared for manufacturing a semiconductor device according to a fourth embodiment of the present invention.
Figure 27:
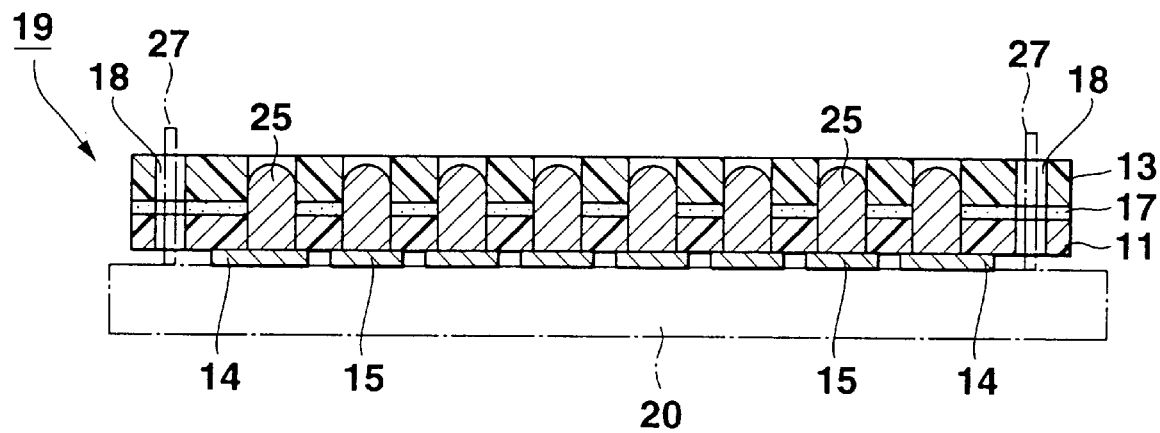
FIG. 27 is a cross sectional view showing the manufacturing step of the semiconductor device following the step shown in FIG. 26.
Figure 28:
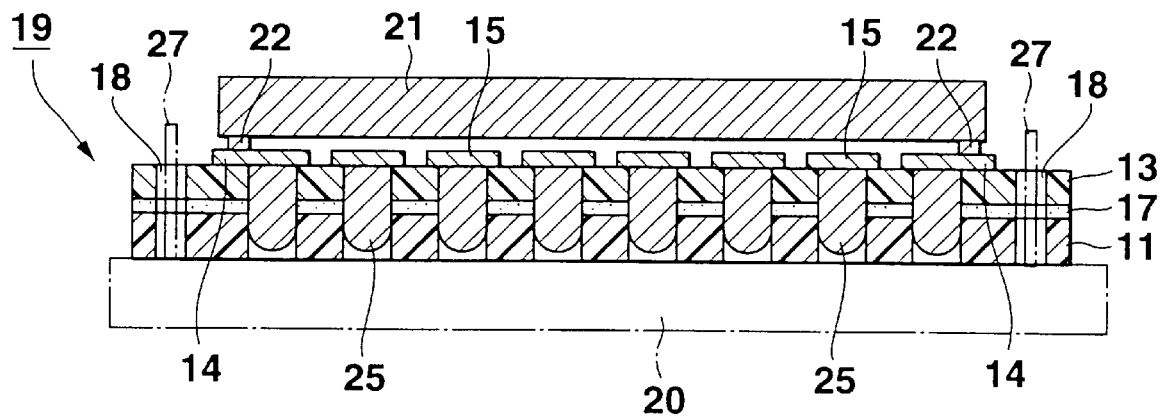
FIG. 28 is a cross sectional view showing the manufacturing step of the semiconductor device following the step shown in FIG. 27.
Figure 29:
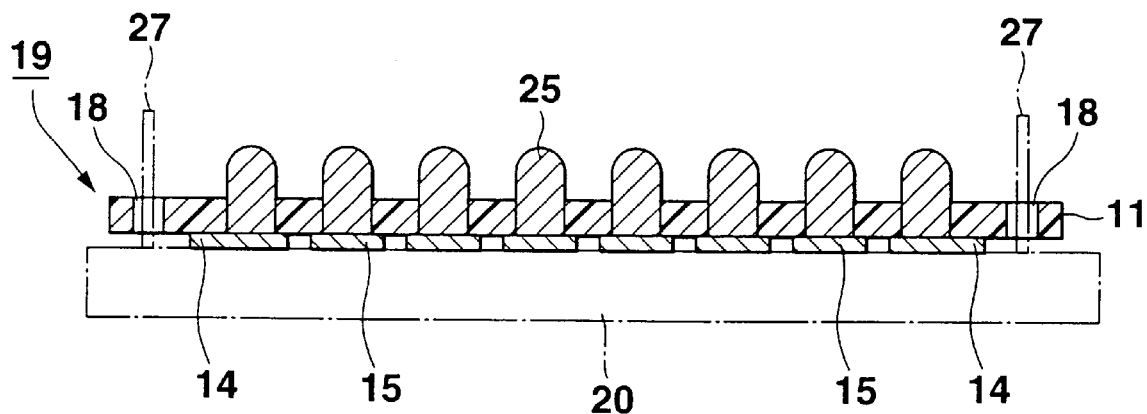
FIG. 29 is a cross sectional view showing the manufacturing step of a semiconductor device according to a fifth embodiment of the present invention and following the step shown in FIG. 27.
Figure 30:
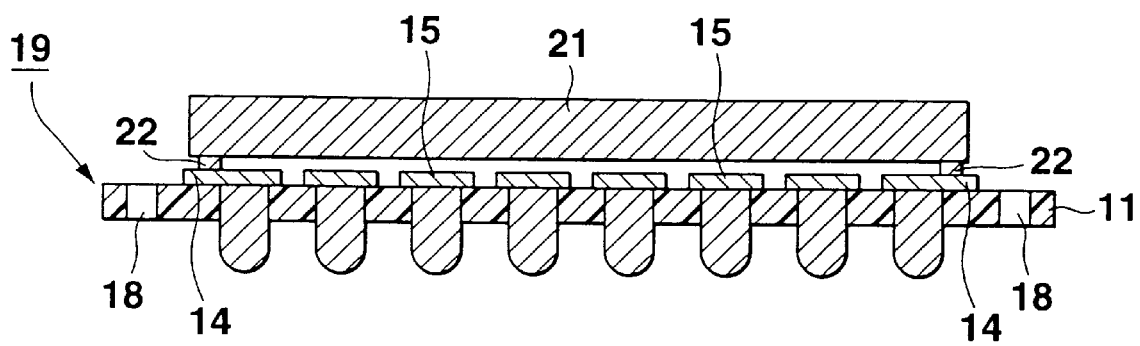
FIG. 30 is a cross sectional view showing the manufacturing step of the semiconductor device following the step shown in FIG. 29.
Figure 31:
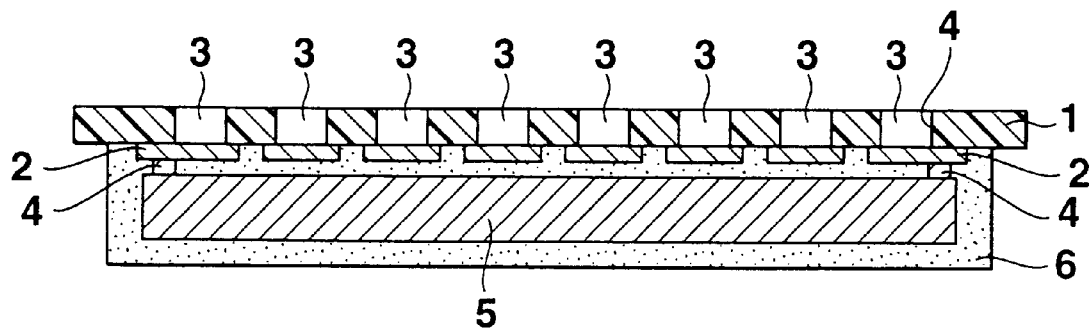
FIG. 31 is a cross sectional view showing the manufacturing step of a conventional semiconductor device.
Figure 32:
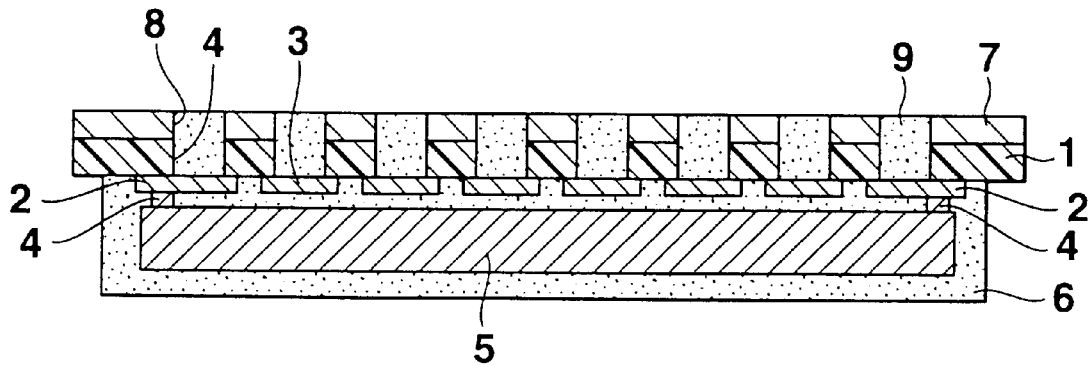
FIG. 32 is a cross sectional view showing the manufacturing step of the semiconductor device following the step shown in FIG. 31.
Figure 33:
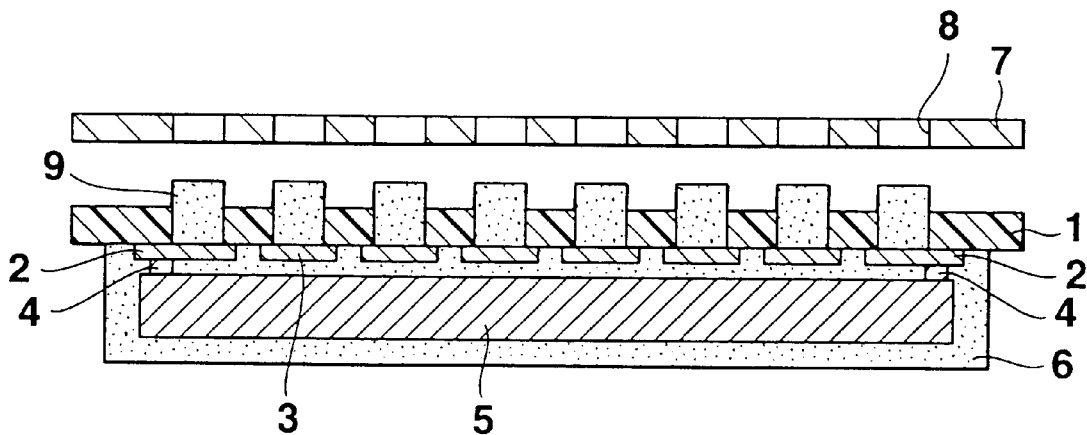
FIG. 33 is a cross sectional view showing the manufacturing step of the semiconductor device following the step shown in FIG. 32.
Figure 34:
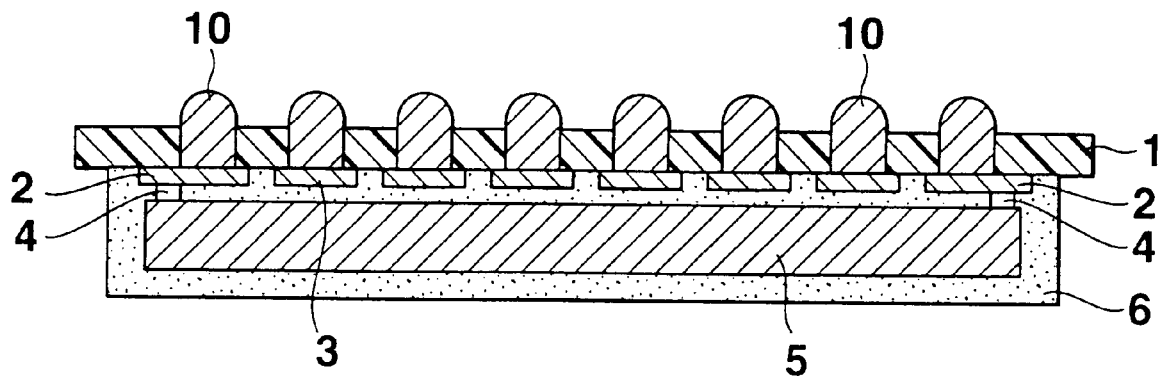
FIG. 34 is a cross sectional view showing the manufacturing step of the semiconductor device following the step shown in FIG. 33.
Figure 35:
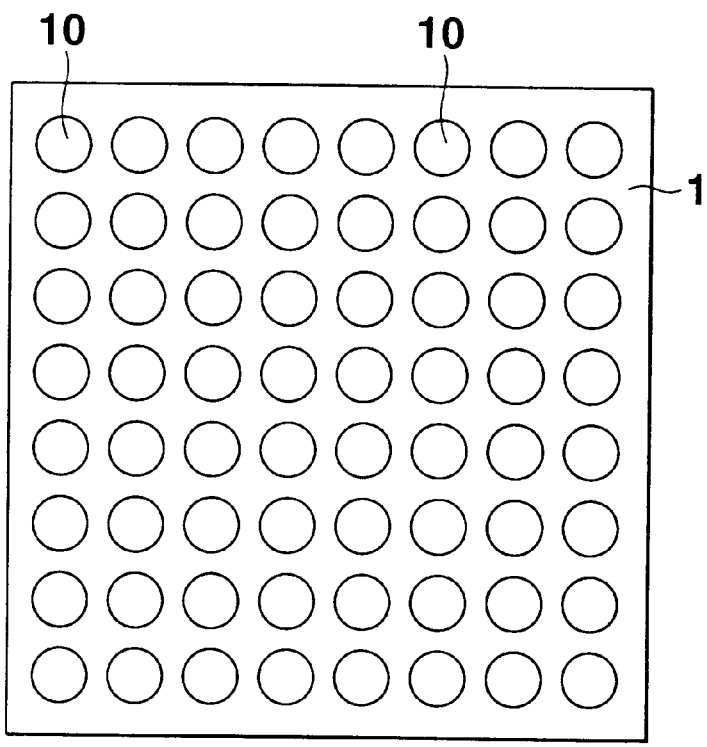
FIG. 35 is a plan view showing the semiconductor device shown in FIG. 34.

It is possible to employ the manufacturing steps shown in FIGS. 26 to 28 in place of the manufacturing steps shown in FIGS. 6 to 10 among the manufacturing steps shown in FIGS. 1 to 10 so as to manufacture a desired semiconductor device. In this case, the conductive paste 24 is loaded in the circular hole 16 by, for example, a screen printing method, as shown in FIG. 26, followed by heating the conductive paste 24 to about 230° C. so as to remove the solvent, etc. from the conductive paste 24, thereby forming the columnar electrode 25, as shown in FIG. 27. Then, the carrier tape 19 is turned upside down so as to permit a plurality of bump electrodes 22 mounted to the peripheral portion on the lower surface of the semi-conductor circuit 21 to be bonded to a plurality of first connection pads 14, respectively. Further, the reinforcing film 13 and the adhesive mass layer 17 are peeled off the film substrate 11 as shown in FIG. 11 so as to obtain a desired semiconductor device. Incidentally, after the manufacturing step shown in FIG. 27, it is possible to peel the reinforcing film 13 and the adhesive mass layer 17 off the film substrate 11 as shown in FIG. 29, followed by bonding the plural bump electrodes 22 mounted to the peripheral portion on the lower surface of the semiconductor circuit 21 to the plural first connection pads 14, respectively, as shown in FIG. 30. It is also possible to apply a reflow treatment to the semiconductor device thus manufactured so as to make the head portion of the columnar electrode close to a sphere, thereby forming a solder ball (projecting electrode) 26. After the semiconductor circuit 21 is connected to the carrier tape 19, it is possible to cut away the both edge portions, in which the sprocket holes are formed, of the film substrate 11.

In each of the embodiments described above, the conductive paste 24 consisting of a solder paste is loaded in the circular holes 16, 32, 33 formed in the films 11 and 13. Alternatively, it is also possible to load a conductive paste that does not contain lead such as Sn/Zn/Cu, Sn/Zn, Sn/Ag/Cu or Sn/Ag/Cu/Bi. Also, in each of the embodiments described above, the semiconductor circuit is mounted to the film substrate 11 by a face-down system. However, it is also possible to employ a face-up system such as a wire bonding system for mounting the semiconductor circuit to the film substrate.

Further, in each of the embodiments described above, the carrier tape 19 is constructed such that a row of semiconductor devices are arranged between two pairs of sprocket holes 18 formed in the edge portions in the width direction of the film substrate 11. Alternatively, the carrier tape 19 may be constructed to have a plurality of rows of semiconductor devices arranged in parallel between pairs of the sprocket holes 18. In this case, it is possible to cut the film substrate for each row of the semiconductor devices in the step of cutting the film substrate 11 in the manufacturing process shown in FIG. 11.

Still further, in each of the embodiments described above, each of the circular holes 16, 32 and 33 is round in its cross section in the planar direction. However, these circular holes may have other cross sectional shapes such as elliptical or polygonal cross sectional shapes.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming projecting electrodes for connection to an electric circuit, comprising:

forming a plurality of holes through a laminate structure including a first film having a plurality of electrode terminals arranged on one surface thereof and a second film bonded to the other surface of said first film, said plurality of holes conforming with said plurality of electrode terminals;

loading a conductive paste in said plurality of holes;

hardening said conductive paste in the holes to form said projecting electrodes, in a manner such that said projecting electrodes are each formed to have a hemispherical head portion; and peeling said second film from said first film with the projecting electrodes left mounted on the first film after the head portions of said projecting electrodes are solidified.

2. The method of forming projecting electrodes according to claim 1, wherein said conductive paste is loaded by performing a screen printing method.

3. The method of forming projecting electrodes according to claim 1, wherein said conductive paste is loaded using an injection nozzle.

4. The method of forming projecting electrodes according to claim 1, wherein said second film is bonded to said first film with an adhesive mass layer interposed therebetween.

5. The method of forming projecting electrodes according to claim 1, wherein said second film is made of a material selected from the group consisting of polyimide, polyether sulfone and polyether imide.

6. The method of forming projecting electrodes according to claim 1, wherein said conductive paste is a solder paste.

7. The method of forming projecting electrodes according to claim 1, wherein said conductive paste is hardened by heating to form said projecting electrodes.

8. The method of forming projecting electrodes according to claim 1, wherein said plurality of holes are formed in said first film and said second film by irradiation with a $CO_2$ laser, a YAG laser or an excimer laser.

9. A method of forming projecting electrodes for connection to an electric circuit, comprising:

forming a plurality of holes through a laminate structure including a first film and a second film bonded to said first film;

forming a plurality of first electrode terminals on said first film and a plurality of second electrode terminals electrically connected to said plurality of first electrode terminals on said first film;

loading a conductive paste in said plurality of holes;

hardening said conductive paste in the holes to form said projecting electrodes, in a manner such that said projecting electrodes are connected to the second electrode terminals and such that said projecting electrodes are each formed to have a hemispherical head portion; and peeling said second film from said first film with the projecting electrodes left mounted on the first film after the head portions of said projecting electrodes are solidified.

10. The method of forming projecting electrodes according to claim 9, wherein said plurality of first electrode terminals are formed to conform with said plurality of holes.

11. A method of forming projecting electrodes for connection to an electric circuit, comprising:

forming a plurality of holes in a second film bonded to one surface of a first film having a plurality of first electrode terminals and a plurality of second electrode terminals arranged on the other surface of said first film, said plurality of second electrode terminals being connected respectively to said first electrode terminals, and said plurality of first holes conforming respectively with said plurality of second electrode terminals;

forming a plurality of second holes in said first film in a manner to conform respectively with said plurality of first holes;

loading a conductive paste in each of said plurality of first holes made in said second film and said plurality of second holes made in said first film;

hardening said conductive paste in the holes to form said projecting electrodes, in a manner such that said projecting electrodes are each formed to have a hemispherical head portion; and peeling said second film from said first film with the projecting electrodes left mounted on the first film after the head portions of said projecting electrodes are solidified.

12. The method of forming projecting electrodes according to claim 11, wherein a diameter of said second holes is larger than a diameter of said first holes.

13. A method of manufacturing a semiconductor device provided with projecting electrodes, comprising:

forming a plurality of holes through a laminate structure having a first film having a plurality of first electrode terminals and a plurality of second electrode terminals connected respectively to said plurality of first electrode terminals, said first and second electrode terminals being arranged on one surface of said first film, and a second film bonded to the other surface of the first film, said plurality of holes conforming, respectively, with said plurality of second electrode terminals;

connecting a plurality of electrode terminals of a semiconductor circuit to said plurality of first electrode terminals, respectively;

loading a conductive paste in said plurality of holes conforming with said plurality of second electrode terminals;

hardening said conductive paste in the holes to form said projecting electrodes;

peeling said second film from said first film with said projecting electrodes left mounted on the first film; and performing a reflow treatment on said projecting electrodes to change a shape of said projecting electrodes, whereby no electric line is formed on a surface of a projecting electrode side of said first film except said projecting electrodes.

14. The method of forming projecting electrodes according to claim 1, further comprising performing a reflow treatment on said projecting electrodes after peeling said second film to expose said projecting electrodes, so as to change a shape of said projecting electrodes.

15. The method of forming projecting electrodes according to claim 9, further comprising performing a reflow treatment on said projecting electrodes after peeling said second film to expose said projecting electrodes, so as to change a shape of said projecting electrodes.

* * * * *